(12) United States Patent
Kuroda

(10) Patent No.: US 12,389,802 B2
(45) Date of Patent: Aug. 12, 2025

(54) PIEZOELECTRIC ACTUATOR

(71) Applicant: KYOCERA Corporation, Kyoto (JP)

(72) Inventor: Wataru Kuroda, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 872 days.

(21) Appl. No.: 17/629,972

(22) PCT Filed: Jul. 16, 2020

(86) PCT No.: PCT/JP2020/027725
§ 371 (c)(1),
(2) Date: Jan. 25, 2022

(87) PCT Pub. No.: WO2021/044744
PCT Pub. Date: Mar. 11, 2021

(65) Prior Publication Data
US 2022/0254981 A1    Aug. 11, 2022

(30) Foreign Application Priority Data
Sep. 4, 2019   (JP) .................................. 2019-161546

(51) Int. Cl.
*H10N 30/88*    (2023.01)
*H10N 30/20*    (2023.01)
*H10N 30/50*    (2023.01)
*H10N 30/87*    (2023.01)

(52) U.S. Cl.
CPC ......... *H10N 30/886* (2023.02); *H10N 30/204* (2023.02); *H10N 30/50* (2023.02); *H10N 30/871* (2023.02)

(58) Field of Classification Search
CPC .... H10N 30/886; H10N 30/204; H10N 30/50; H10N 30/871; H10N 30/88; H10N 30/20; H10N 30/87; H02N 2/04
See application file for complete search history.

(56) References Cited

U.S. PATENT DOCUMENTS

| | | | | |
|---|---|---|---|---|
| 5,113,108 A | * | 5/1992 | Yamashita | H10N 30/50 310/346 |
| 7,429,815 B2 | * | 9/2008 | Gibson | F02M 47/027 310/344 |
| 2009/0026890 A1 | * | 1/2009 | Goat | H10N 30/045 310/348 |

FOREIGN PATENT DOCUMENTS

| | | |
|---|---|---|
| JP | 03-248581 A | 11/1991 |
| JP | 2003-037983 A | 2/2003 |
| JP | 2010-192832 A | 9/2010 |

(Continued)

*Primary Examiner* — Emily P Pham
(74) *Attorney, Agent, or Firm* — Volpe Koenig

(57) ABSTRACT

A piezoelectric actuator includes a piezoelectric element, and a case accommodating the piezoelectric element. The case is deformable to conform with expansion or contraction of the piezoelectric element. The case includes a cylinder including a first end portion being open, and a first cap including a first end plate being circular and a first protrusion being annular. The first protrusion is located on a first surface of the first end plate and protrudes perpendicularly to the first surface. The cylinder includes the first end portion receiving the first protrusion on the first cap. The first end portion includes an inner peripheral surface joined to an outer peripheral surface of the first protrusion. The first end portion includes an edge located nearer an edge of the first protrusion than the first surface of the first end plate in an axial direction of the cylinder.

12 Claims, 9 Drawing Sheets

(56) References Cited

FOREIGN PATENT DOCUMENTS

| | | |
|---|---|---|
| JP | 2014-202316 A | 10/2014 |
| JP | 2017-228574 A | 12/2017 |
| WO | 2017/199668 A1 | 11/2017 |

* cited by examiner

PIEZOELECTRIC ACTUATOR

FIELD

The present disclosure relates to a piezoelectric actuator.

BACKGROUND

A known encapsulated multilayer piezoelectric actuator includes a multilayer piezoelectric element accommodated in an expandable metal case. The multilayer piezoelectric element includes a stack of alternate piezoelectric ceramic layers and internal electrode layers. The metal case includes a hollow member to allow communication between inside and outside. The hollow member is sealed with upper and lower caps to block communication between inside and outside the metal case (refer to, for example, Patent Literature 1).

In the known piezoelectric actuator, the expandable hollow member is joined to the upper and lower caps and thus expands in response to expansion of the piezoelectric element. This structure is likely to cause stress concentration at joints between the hollow member and the upper and lower caps, possibly degrading the sealing of the hollow member. Thus, the known piezoelectric actuator is to be more durable.

CITATION LIST

Patent Literature

Patent Literature 1: Japanese Unexamined Patent Application Publication No. 2010-192832

BRIEF SUMMARY

A piezoelectric actuator according to one or more aspects of the present disclosure includes a piezoelectric element, and a case accommodating the piezoelectric element. The case is deformable to conform with expansion or contraction of the piezoelectric element. The case includes a cylinder including a first end portion being open, and a first cap including a first end plate being circular and a first protrusion being annular. The first protrusion is located on a first surface of the first end plate and protrudes perpendicularly to the first surface. The cylinder includes the first end portion receiving the first protrusion on the first cap. The first end portion includes an inner peripheral surface joined to an outer peripheral surface of the first protrusion. The first end portion includes an edge located nearer an edge of the first protrusion than the first surface of the first end plate in an axial direction of the cylinder.

BRIEF DESCRIPTION OF DRAWINGS

The objects, features, and advantages of the present invention will become more apparent from the following detailed description and the drawings.

DETAILED DESCRIPTION

Figure 1:
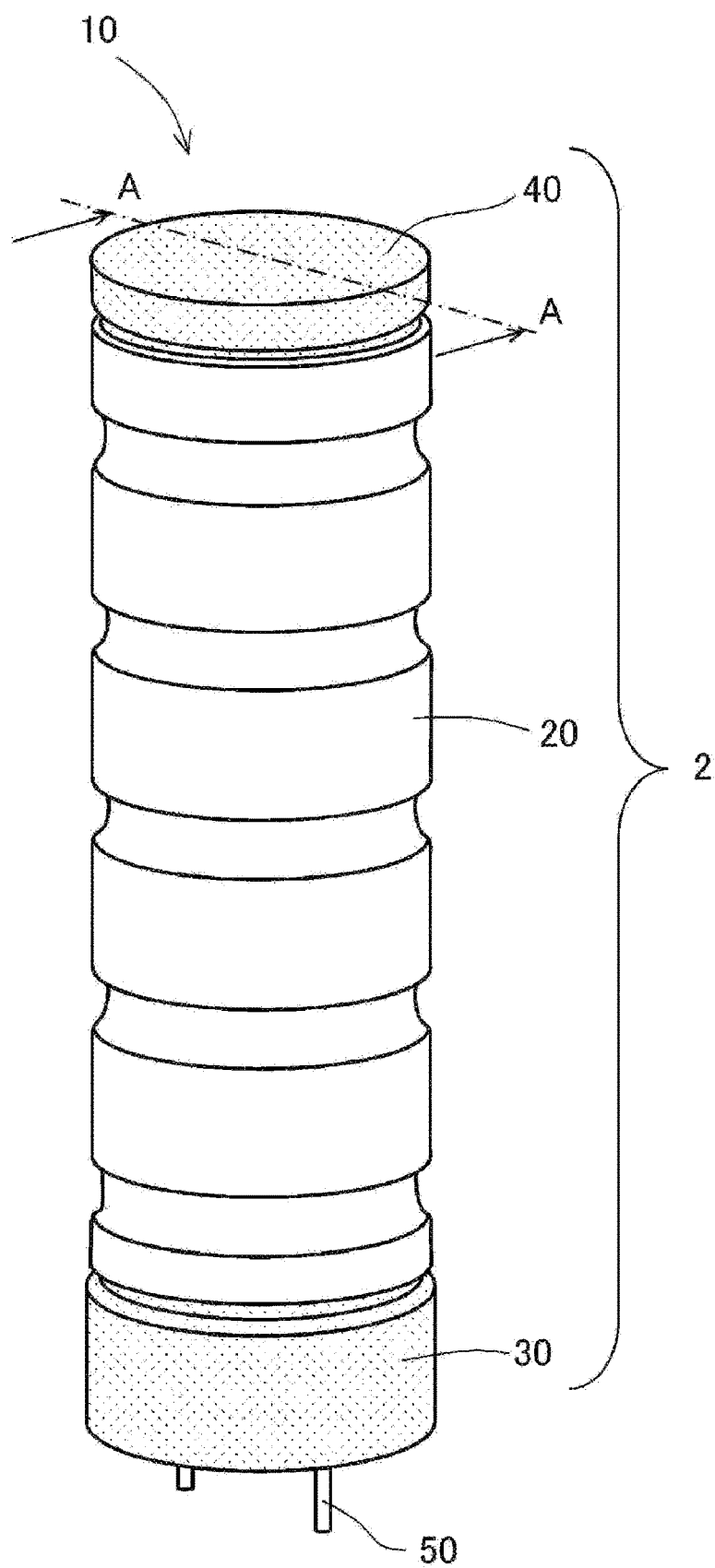
FIG. 1 is a schematic perspective view of a piezoelectric actuator according to a first embodiment of the present disclosure.
Figure 2:
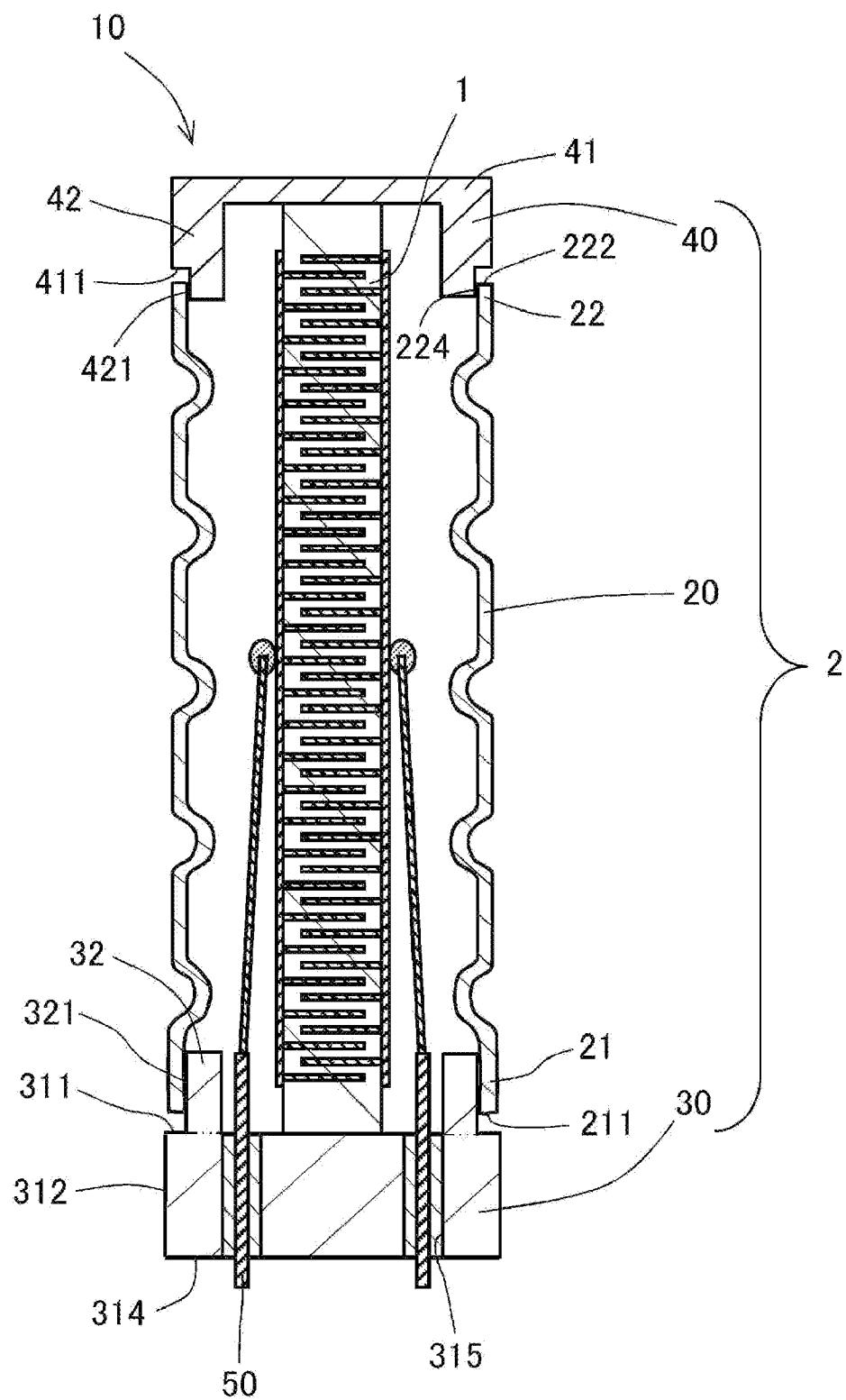
FIG. 2 is a schematic longitudinal sectional view of the piezoelectric actuator taken along line A-A in FIG. 1.
Figure 3:
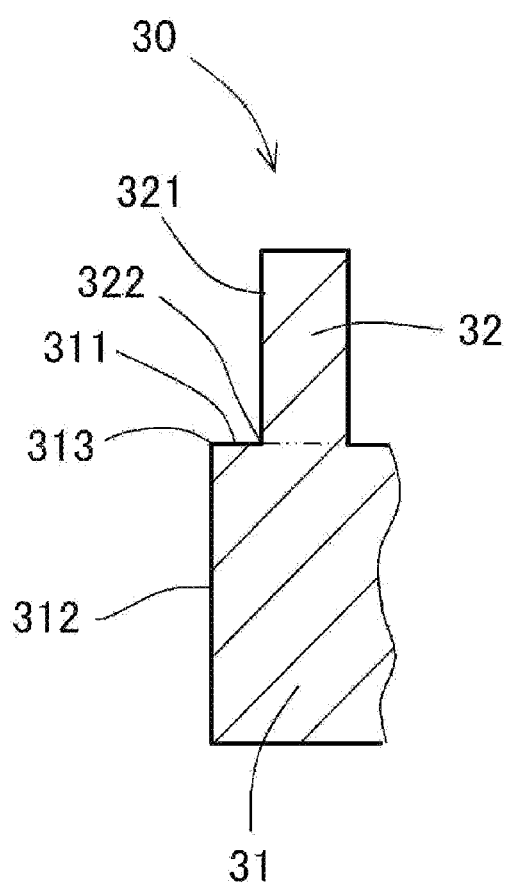
FIG. 3 is an enlarged longitudinal sectional view of a first cap in the piezoelectric actuator according to the first embodiment of the present disclosure.
Figure 4:
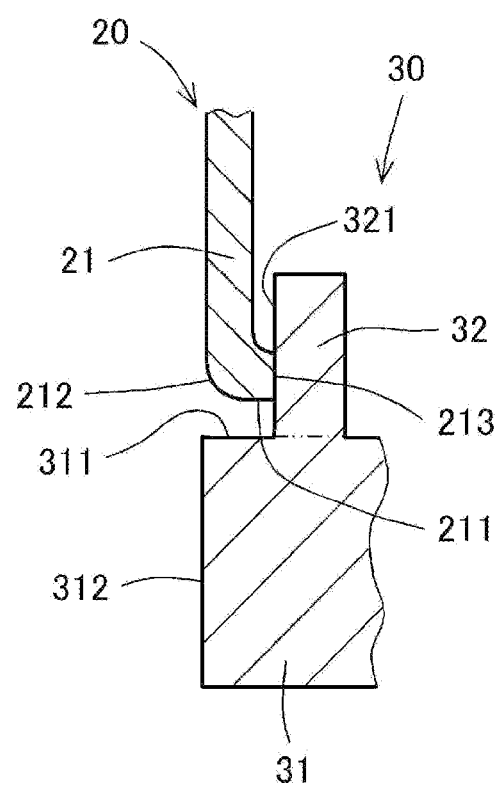
FIG. 4 is an enlarged longitudinal sectional view of the first cap received in a cylinder in the piezoelectric actuator according to the first embodiment of the present disclosure.

A piezoelectric actuator according to a first embodiment of the present disclosure will now be described with reference to the drawings. FIG. 1 is a schematic perspective view of a piezoelectric actuator 10 according to the first embodiment. FIG. 2 is a schematic longitudinal sectional view of the piezoelectric actuator 10 taken along line A-A in FIG. 1. FIG. 3 is an enlarged longitudinal sectional view of a first cap 30 in the piezoelectric actuator 10. FIG. 4 is an enlarged longitudinal sectional view of the first cap 30 received in a cylinder 20 in the piezoelectric actuator 10. The invention is not limited to one or more embodiments described below.

The piezoelectric actuator 10 shown in FIGS. 1 to 4 includes a piezoelectric element 1 and a case 2. The case 2 accommodates the piezoelectric element 1. The case 2 includes the cylinder 20, the first cap 30, and a second cap 40.

The piezoelectric element 1 included in the piezoelectric actuator 10 is, for example, a multilayer piezoelectric element. As shown in FIG. 2, the piezoelectric element 1 includes a stack including, for example, an active portion in which piezoelectric layers and internal electrode layers are alternately stacked and an inactive portion in which piezoelectric layers are stacked on both ends of the active portion in the stacking direction. In the active portion, the piezoelectric layers expand or contract in the stacking direction upon being driven. In the inactive portion, the piezoelectric layers do not expand or contract in the stacking direction upon being driven.

The stack in the piezoelectric element 1 is, for example, a rectangular prism having a length of about 4 to 7 mm, a width of about 4 to 7 mm, and a height of about 20 to 50 mm. The stack may be, for example, a hexagonal prism or an octagonal prism.

The piezoelectric layers in the stack are formed from a piezoelectric ceramic with piezoelectric properties. The piezoelectric ceramic may contain a powder with a mean particle size of, for example, 1.6 to 2.8 µm. Examples of the piezoelectric ceramic include perovskite oxides, such as lead zirconate titanate ($PbZrO_3$—$PbTiO_3$), lithium niobate ($LiNbO_3$), and lithium tantalate ($LiTaO_3$).

The internal electrode layers in the stack may mainly contain a metal such as silver, a silver-palladium alloy, a silver-platinum alloy, or copper. The internal electrode layers include, for example, positive electrodes and negative electrodes alternately located in the stacking direction. The positive electrodes extend to one side surface of the stack.

The negative electrodes extend to another side surface of the stack. In the active portion with this structure, a driving voltage can be applied to a piezoelectric layer between adjacent internal electrode layers in the stacking direction. The stack may also include metal layers for stress relaxation that do not serve as internal electrode layers.

The stack has a pair of opposing side surfaces covered with external electrodes. The positive or negative electrodes (or a ground electrode) included in the internal electrode layers extend to these side surfaces for electrical connection to the external electrodes. The external electrodes may be, for example, metallized layers containing silver and glass.

The stack has another pair of opposing side surfaces at which the positive and negative electrodes (or the ground electrode) included in the internal electrode layers are exposed. These side surfaces may be covered with an insulating coating as appropriate. The coating may reduce creeping discharge between the positive and negative electrodes under a high voltage applied for driving. The insulating coating may be, for example, a ceramic material. To avoid creeping discharge resulting from peeling of the coating, the ceramic material may be deformable under stress to conform with the deformation (e.g., expansion or contraction) of the stack when the piezoelectric actuator is driven.

Examples of the coating material include partially stabilized zirconia that locally undergoes phase transformation under stress to change volume and deform, a ceramic material such as $Ln_{1-x}Si_xAlO_{3+0.5x}$ (where Ln is at least one selected from the group consisting of Sn, Y, La, Ce, Pr, Nd, Pm, Sm, Eu, Gd, Tb, Dy, Ho, Er, Tm, and Yb, and x=0.01 to 0.3), or a piezoelectric material that undergoes a change in the interionic distance in the crystal lattice to relax any stress, such as barium titanate or lead zirconate titanate. The coating is formed by, for example, applying ink containing any of the ceramic and piezoelectric materials listed above onto the side surfaces of the stack by dipping or screen printing, and then sintering the ink.

The case 2 in the piezoelectric actuator 10 accommodates the piezoelectric element 1. The piezoelectric element 1 has a lower end face in contact with the upper face of the first cap 30, and an upper end face in contact with the lower face of the second cap 40.

The cylinder 20 vertically extends and is open at both ends. The cylinder 20 is, for example, a seamless tube prepared in a predetermined shape. The seamless tube is then shaped into a bellows-shape or accordion-shape by rolling or isostatic pressing. The cylinder 20 has a predetermined spring constant to conform with the expansion and contraction of the piezoelectric element 1 under a voltage applied to the piezoelectric element 1. The cylinder 20 may have a spring constant adjusted in accordance with the thickness of the cylinder 20 or the number or the shape of grooves on the cylinder 20. The cylinder 20 may have a thickness of, for example, 0.1 to 0.5 mm.

As shown in FIG. 3, the first cap 30 includes a circular first end plate 31 and an annular first protrusion 32. The first protrusion 32 is located on a first surface 311 of the first end plate 31 and protrudes perpendicularly to the first surface 311.

As shown in FIG. 4, the first cap 30 has an outer diameter substantially the same as the inner diameter of the opening in a first end portion 21 of the cylinder 20. The first cap 30 is fitted in the cylinder 20 through the opening in the first end portion 21 to have the first protrusion 32 received in the first end portion 21 of the cylinder 20. The first end portion 21 of the cylinder 20 has an inner peripheral surface 213 joined to an outer peripheral surface 321 of the first protrusion 32 on the first cap 30. The first end portion 21 has an edge (or an open end) 211 located nearer the edge of the first protrusion 32 than the first surface 311 of the first end plate 31 in the axial direction of the cylinder 20. The inner peripheral surface 213 of the first end portion 21 may be joined to the outer peripheral surface 321 of the first protrusion 32 by, for example, laser welding or resistance welding.

The first end portion 21 has the edge 211 located nearer the edge of the first protrusion 32 than the first surface 311 of the first end plate 31 to reduce stress concentration at the clearance between the cylinder 20 and the first cap 30 when the piezoelectric element 1 expands. This reduces deformation of the outer periphery of the first cap and is thus less likely to degrade the sealing.

The first cap 30 may have a corner 313 between an outer peripheral surface 312 and the first surface 311 of the first end plate 31. The first cap 30 may have a corner 322 between the outer peripheral surface 321 of the first protrusion 32 and the first surface 311 of the first end plate 31.

The corners 313 and 322 of the first cap 30 receive stress. This structure thus distributes and relaxes stress concentrating on other parts in a known structure.

The first end portion 21 may have an outer peripheral surface 212 curved across the entire circumference as in the present embodiment. This structure reduces stress concentration at the joint between the cylinder 20 and the first protrusion 32. The curved peripheral surface can change its curvature and distributes stress resulting from expansion of the piezoelectric element 1.

As shown in FIG. 2, the second cap 40 includes a circular second end plate 41 and an annular second protrusion 42. The second protrusion 42 is located on a third surface 411 of the second end plate 41. The cylinder 20 has an open second end portion 22 opposite to the first end portion 21. The cylinder 20 has the second end portion 22 receiving the second protrusion 42 on the second cap 40. The second end portion 22 has an inner peripheral surface 224 joined to an outer peripheral surface 421 of the second protrusion 42. The second end portion 22 has an end face 222 spaced from the third surface 411 of the second end plate 41. The inner peripheral surface 224 of the second end portion 22 may be joined to the outer peripheral surface 421 of the second protrusion 42 by, for example, laser welding or resistance welding.

The piezoelectric actuator 10 with this structure according to the present embodiment reduces stress concentration at the joint between the inner peripheral surface 224 of the second end portion 22 and the outer peripheral surface 421 of the second protrusion 42. The structure also more efficiently distributes stress resulting from expansion of the piezoelectric element 1 than a structure with the case 2 including the first cap 30 alone.

The cylinder 20, the first cap 30, and the second cap 40 may be formed from a metal such as SUS304 or SUS316L.

The first end plate 31 may have through-holes 315 extending from the first surface 311 to a second surface 314 opposite to the first surface 311. The through-holes 315 may receive lead pins 50 electrically connected to the piezoelectric element 1.

Figure 5:
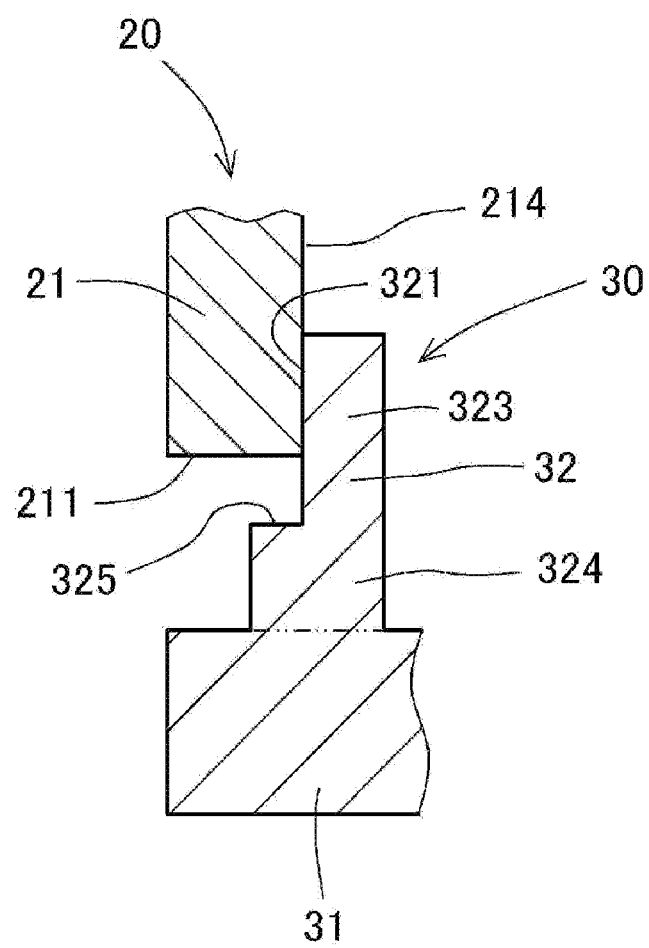
FIG. 5 is an enlarged longitudinal sectional view of a first cap received in a cylinder in a piezoelectric actuator according to a second embodiment of the present disclosure.

A piezoelectric actuator according to a second embodiment of the present disclosure will now be described with reference to the drawing. FIG. 5 is an enlarged longitudinal sectional view of a first cap 30 including a first protrusion 32 received in a first end portion 21 of a cylinder 20 in a piezoelectric actuator 10 according to the present embodiment.

The first protrusion 32 includes an annular first section 323 and an annular second section 324. The second section 324 is located nearer a first end plate 31 than the first section 323. The second section 324 has a larger outer diameter than the first section 323. The first end portion 21 has an inner peripheral surface 214 joined to an outer peripheral surface 321 of the first section 323. In the present embodiment, the first end portion 21 has an edge 211 spaced from an upper face 325 of the second section 324 of the first protrusion 32. This structure distributes stress across the entire circumference at the boundary with the second section 324 thicker than the first section 323 when torsional stress results from a slight difference in the expansion or contraction direction between a piezoelectric element 1 and a case 2. The piezoelectric actuator 10 is thus less likely to degrade the sealing after prolonged and repeated driving.

The piezoelectric actuator 10 with this structure according to the present embodiment reduces stress concentration at the joint between the inner peripheral surface 214 of the first end portion 21 of the cylinder 20 and the outer peripheral surface 321 of the first section 323 of the first protrusion 32. The structure also distributes stress resulting from expansion of the piezoelectric element 1 and reduces cracks at the joint.

Figure 6:
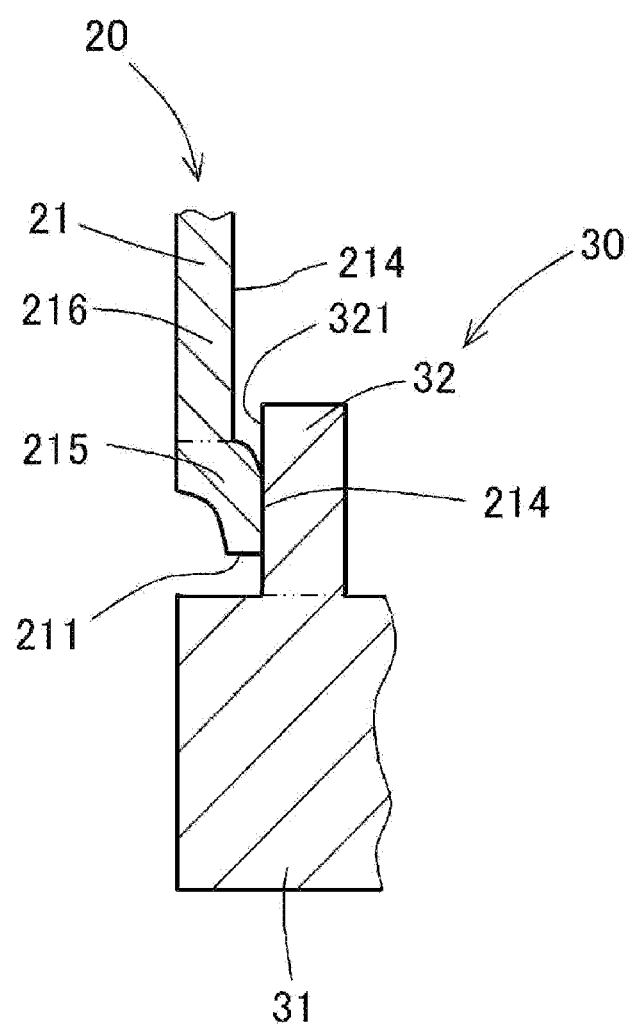
FIG. 6 is an enlarged longitudinal sectional view of a first cap received in a cylinder in a piezoelectric actuator according to a third embodiment of the present disclosure.

A piezoelectric actuator according to a third embodiment of the present disclosure will now be described with reference to the drawings. FIG. 6 is an enlarged longitudinal sectional view of a first cap 30 including a first protrusion 32 received in a first end portion 21 of a cylinder 20 in a piezoelectric actuator 10 according to the present embodiment.

The first end portion 21 of the cylinder 20 includes a first portion 215 having an edge 211, and a second portion 216. The second portion 216 is located inward from the first portion 215 in the axial direction of the cylinder 20 and has a larger inner diameter than the first portion 215. The first portion 215 has an inner peripheral surface 214 joined to an outer peripheral surface 321 of the first protrusion 32. The second portion 216 has an inner peripheral surface 214 spaced from the outer peripheral surface 321 of the first protrusion 32 in the radial direction of the cylinder 20.

The piezoelectric actuator 10 with this structure according to the present embodiment reduces stress concentration at the joint between the inner peripheral surface 214 of the first portion 215 and the outer peripheral surface 321 of the first protrusion 32. The structure also distributes any stress resulting from expansion of a piezoelectric element 1. The structure also reduces axial wobbling of the piezoelectric element 1, in addition to achieving stress distribution.

Figure 7:
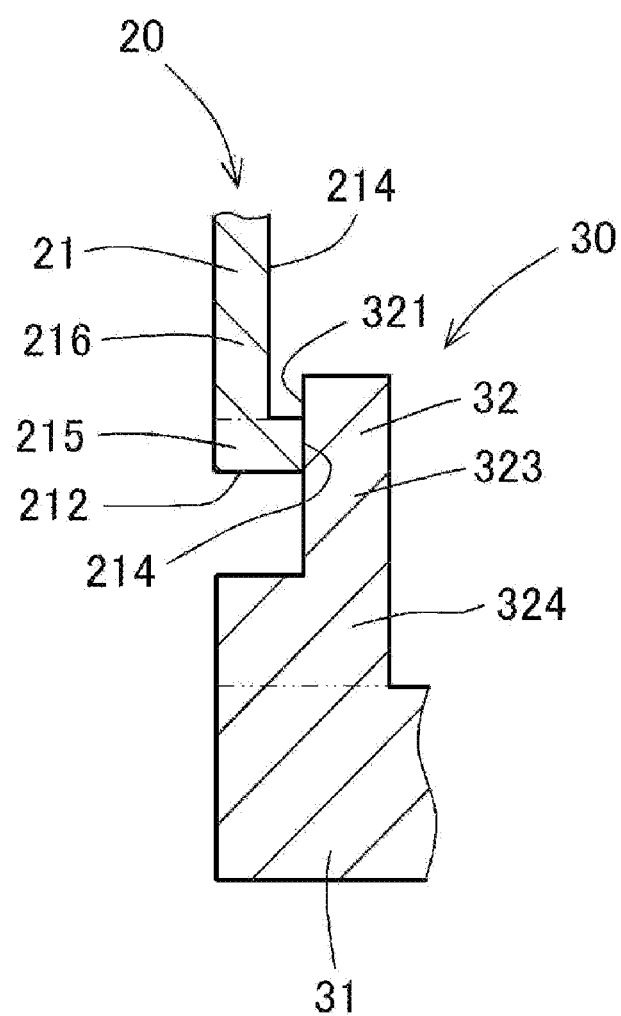
FIG. 7 is an enlarged longitudinal sectional view of the first cap in the piezoelectric actuator according to the second embodiment of the present disclosure received in the cylinder in the third embodiment.

The first end portion 21 in the present embodiment may replace the first end portion 21 in the piezoelectric actuator 10 according to the second embodiment of the present disclosure. In this case, a first portion 215 has an inner peripheral surface 214 joined to the outer peripheral surface 321 of the first section 323 as shown in FIG. 7.

The piezoelectric actuator 10 with this structure according to the present embodiment reduces stress concentration at the joint between the inner peripheral surface 214 of the second portion 216 and the outer peripheral surface 321 of the first section 323. The structure also distributes stress resulting from expansion of the piezoelectric element 1. The structure also reduces axial wobbling of the piezoelectric element 1, in addition to achieving stress distribution.

Figure 8:
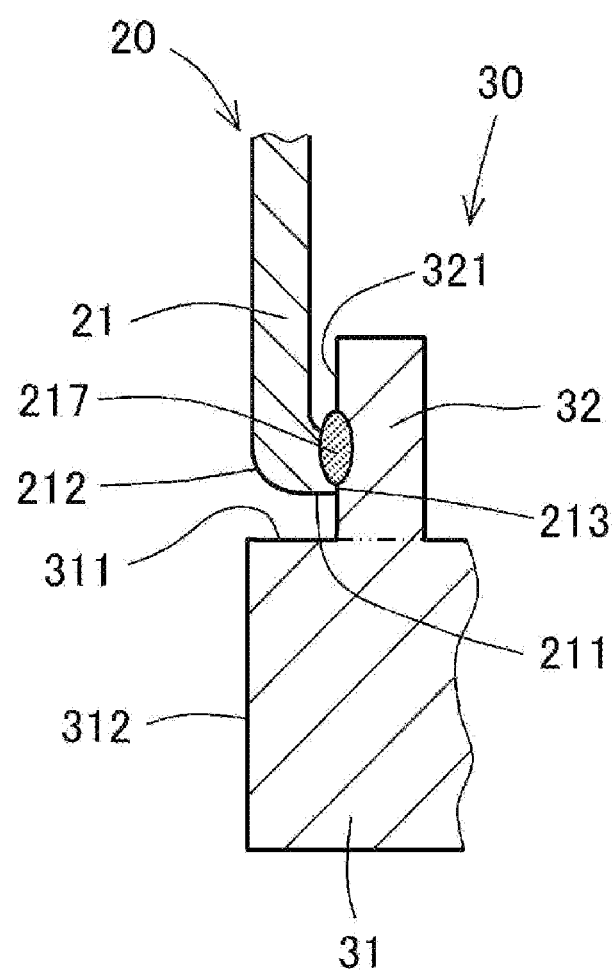
FIG. 8 is an enlarged longitudinal sectional view of a first cap received in a cylinder in a piezoelectric actuator according to a fourth embodiment of the present disclosure.
Figure 9:
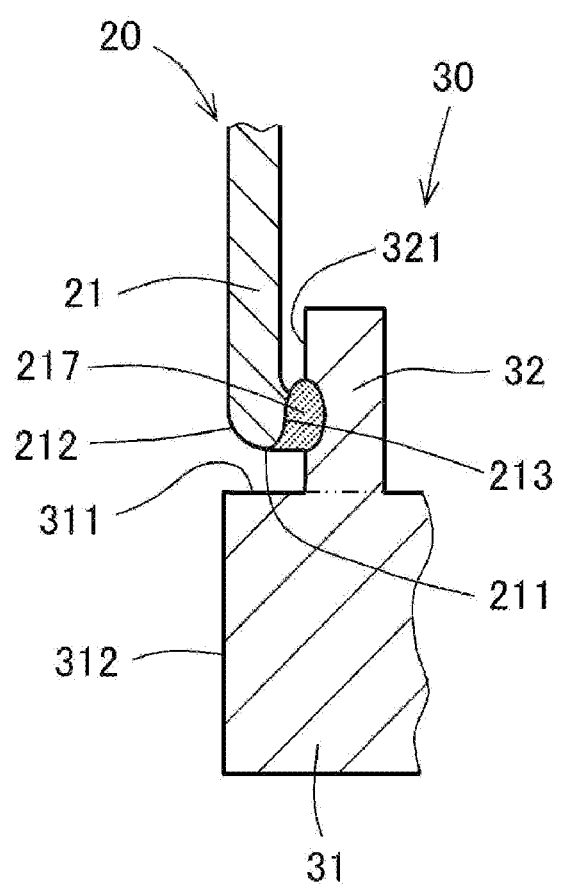
FIG. 9 is an enlarged longitudinal sectional view of a modification of the piezoelectric actuator shown in FIG. 8.

A piezoelectric actuator according to a fourth embodiment of the present disclosure will now be described with reference to the drawings. FIG. 8 is an enlarged longitudinal sectional view of a first cap 30 including a first protrusion 32 received in a first end portion 21 of a cylinder 20 in a piezoelectric actuator 10 according to the present embodiment. FIG. 9 is an enlarged longitudinal sectional view of a modification of the piezoelectric actuator 10 shown in FIG. 8.

As shown in FIG. 8, the piezoelectric actuator 10 may include a case 2 including a metal joint 217 located between an inner peripheral surface 213 of the first end portion 21 and an outer peripheral surface 321 of the first protrusion 32. The case 2 including the metal joint 217 distributes, across the outer peripheral surface of the metal joint 217, stress resulting from expansion of a piezoelectric element 1 and concentrating at the joint between the first end portion 21 and the first protrusion 32. The structure reduces linear development of microcracks and is thus less likely to degrade the sealing under stress concentration at an edge 211 of the first end portion 21. The first end portion 21 may have an outer peripheral surface 212 curved across the entire circumference to relax stress more effectively.

The metal joint 217 has a different crystal structure from the first cap 30 and the cylinder 20. The metal joint 217 may be formed by, for example, counterdiffusion of the components of the first cap 30 and the cylinder 20. The metal joint 217 may be formed by diffusion of the metal contained in the first cap 30 into the cylinder 20, or diffusion of the metal contained in the cylinder 20 into the first cap 30. The metal joint 217 may be formed by, for example, melting the inner peripheral surface 213 of the first end portion 21 and the outer peripheral surface 321 of the first protrusion 32 with laser irradiation for welding the first cap 30 and the cylinder 20. The metal joint 217 may contain, for example, the components of the first cap 30 and the cylinder 20.

The metal joint 217 may have any cross-sectional shape, such as circular, elliptic, or oval. The metal joint 217 may extend entirely or partially across the inner peripheral surface 213 of the first end portion 21. The metal joint 217 and its shape may be detected by structural analysis using, for example, an electron probe microanalyzer (EPMA).

As shown in FIG. 9, the metal joint 217 may extend to the edge 211 of the first end portion 21. The structure reduces microcracks developing from the edge 211 of the first end portion 21 under stress concentrating at the edge 211. The structure thus relaxes stress more effectively and is less likely to degrade the sealing. The metal joint 217 may be located on the outer peripheral surface of the first end portion 21.

In the examples described above, the case 2 includes the metal joint 217 located between the first end portion 21 and the first protrusion 32. In some embodiments, the case 2 may include a metal joint 217 located between an inner peripheral surface 224 of a second end portion 22 and an outer peripheral surface 421 of a second protrusion 42. In some embodiments, the case 2 may include the metal joint 217 located between the first end portion 21 and the first protrusion 32, and the metal joint 217 located between the second end portion 22 and the second protrusion 42. The piezoelectric actuator 10 according to the present embodiment effectively distributes stress between the cylinder 20 and at least either the first cap 30 or a second cap 40 when the piezoelectric element 1 expands. The structure reduces development of microcracks at the joint between the cylinder 20 and at least either the first cap 30 or the second cap 40 and is less likely to degrade the sealing.

The piezoelectric actuator according to one or more embodiments of the present disclosure may include any piezoelectric element other than a multilayer piezoelectric element described above.

REFERENCE SIGNS LIST 1 piezoelectric element
2 case
10 piezoelectric actuator
20 cylinder
21 first end portion
211 edge
22 second end portion
222 end face
224 inner peripheral surface
212, 312, 321 outer peripheral surface
213, 214 inner peripheral surface
215 first portion
216 second portion
217 metal joint
30 first cap
31 first end plate
32 first protrusion
311 first surface
312 outer peripheral surface
313 corner
314 second surface
315 through-hole
321 outer peripheral surface
322 corner
323 first section
324 second section
325 upper face
40 second cap
41 second end plate
42 second protrusion
411 third surface
421 outer peripheral surface
50 lead pin

The invention claimed is:

1. A piezoelectric actuator, comprising:
a piezoelectric element; and
a case accommodating the piezoelectric element, the case being deformable to conform with expansion or contraction of the piezoelectric element, the case including
a cylinder including a first end portion being open, and
a first cap including a first end plate being circular and a first protrusion being annular, the first protrusion being located on a first surface of the first end plate and protruding perpendicularly to the first surface,
wherein the cylinder includes the first end portion receiving the first protrusion on the first cap, the first end portion includes an inner peripheral surface joined to an outer peripheral surface of the first protrusion, and
wherein an edge of the first end portion is located nearer to an edge of the first protrusion than to the first surface of the first end plate in an axial direction of the cylinder.

2. The piezoelectric actuator according to claim 1, wherein
the first cap has a corner joining an outer peripheral surface of the first end plate and the first surface.

3. The piezoelectric actuator according to claim 1, wherein
the first cap includes a corner joining the outer peripheral surface of the first protrusion and the first surface.

4. The piezoelectric actuator according to claim 1, wherein
the first end portion includes a curved outer peripheral surface.

5. The piezoelectric actuator according to claim 1, wherein
the case further includes a metal joint located between the inner peripheral surface of the first end portion and the outer peripheral surface of the first protrusion.

6. The piezoelectric actuator according to claim 1, wherein
the first protrusion includes a first section being annular and a second section being annular, and the second section is located nearer the first end plate than the first section and has a larger outer diameter than the first section, and
the first end portion includes the inner peripheral surface joined to an outer peripheral surface of the first section.

7. The piezoelectric actuator according to claim 6, wherein
the first end portion includes the edge spaced from an upper face of the second section of the first protrusion.

8. The piezoelectric actuator according to claim 7, wherein
the first end portion of the cylinder includes
a first portion including the end edge, and
a second portion located inward from the first portion in the axial direction of the cylinder and having a larger inner diameter than a diameter of the first portion, wherein
the first portion includes an inner peripheral surface joined to the outer peripheral surface of the first protrusion, and
the second portion includes an inner peripheral surface spaced from the outer peripheral surface of the first protrusion in a radial direction of the cylinder.

9. The piezoelectric actuator according to claim 8, wherein
the inner peripheral surface of the second portion is joined to the outer peripheral surface of the first section.

10. The piezoelectric actuator according to claim 1, wherein
the first end plate has a through-hole extending from the first surface to a second surface opposite to the first surface, and the through-hole receives a lead pin electrically connected to the piezoelectric element.

11. The piezoelectric actuator according to claim 1, wherein
the case further includes a second cap including
a second end plate being circular, and
a second protrusion being annular and located on a third surface of the second end plate, wherein
the cylinder includes a second end portion opposite to the first end portion, and the second end portion is open
the second end portion receives the second protrusion on the second cap,
the second end portion includes an inner peripheral surface joined to an outer peripheral surface of the second protrusion, and
the second end portion includes an end face spaced from the third surface of the second end plate.

12. The piezoelectric actuator according to claim 1, wherein the first end portion of the cylinder includes
a first portion including the end face, and
a second portion located inward from the first portion in the axial direction of the cylinder and having a larger inner diameter than a diameter of the first portion, wherein
the first portion includes an inner peripheral surface joined to the outer peripheral surface of the first protrusion, and the second portion includes an inner peripheral surface spaced from the outer peripheral surface of the first protrusion in a radial direction of the cylinder.

\* \* \* \* \*